United States Patent
Le et al.

(10) Patent No.: US 10,720,570 B2
(45) Date of Patent: Jul. 21, 2020

(54) MAGNETIC SENSOR USING SPIN HALL EFFECT

(71) Applicant: Western Digital Technologies, Inc., San Jose, CA (US)

(72) Inventors: Quang Le, San Jose, CA (US); David John Seagle, Morgan Hill, CA (US); Xiaoyong Liu, San Jose, CA (US); Daniele Mauri, San Jose, CA (US); Yongchul Ahn, San Jose, CA (US); Hongquan Jiang, San Jose, CA (US); Guangli Liu, Pleasanton, CA (US); David Patrick Druist, San Jose, CA (US); Jui-Lung Li, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/826,578

(22) Filed: Nov. 29, 2017

(65) Prior Publication Data

US 2018/0358543 A1 Dec. 13, 2018

Related U.S. Application Data

(60) Provisional application No. 62/518,540, filed on Jun. 12, 2017.

(51) Int. Cl.
*H01L 43/06* (2006.01)
*G01R 33/07* (2006.01)
(Continued)

(52) U.S. Cl.
CPC .............. *H01L 43/06* (2013.01); *G01R 33/07* (2013.01); *G01R 33/09* (2013.01);
(Continued)

(58) Field of Classification Search
CPC ....... H01L 43/06; H01L 27/222; H01L 43/04; H01L 43/08; H01L 43/10; H01L 43/14;
(Continued)

(56) References Cited

U.S. PATENT DOCUMENTS 8,941,954 B2   1/2015   Le et al.
9,164,155 B2  10/2015   Ausserlechner
(Continued)

FOREIGN PATENT DOCUMENTS

| CN | 104795489 A | 7/2015 |
| WO | 2014089182 A1 | 6/2014 |
| WO | 2016011435 A1 | 1/2016 |

OTHER PUBLICATIONS

Liu et al, U.S. Appl. No. 15/385,595, filed Dec. 20, 2016.
(Continued)

*Primary Examiner* — Didarul A Mazumder
(74) *Attorney, Agent, or Firm* — Loza & Loza, LLP; Gabriel Fitch (57) ABSTRACT

Magnetic sensors using spin Hall effect and methods for fabricating same are provided. One such magnetic sensor includes a spin Hall layer including an electrically conductive, non-magnetic material, a magnetic free layer adjacent to the spin Hall layer, a pair of push terminals configured to enable an electrical current to pass through the magnetic free layer and the spin Hall layer in a direction that is perpendicular to a plane of the free and spin Hall layers, and a pair of sensing terminals configured to sense a voltage when the electrical current passes through the magnetic free layer and the spin Hall layer, where each of the push and sensing terminals is electrically isolated from the other terminals.

25 Claims, 10 Drawing Sheets

(51) Int. Cl.
| | |
|---|---|
| G01R 33/09 | (2006.01) |
| H01L 43/04 | (2006.01) |
| H01L 43/14 | (2006.01) |
| G11C 11/18 | (2006.01) |
| H01L 43/08 | (2006.01) |
| H01L 43/10 | (2006.01) |
| G11B 5/012 | (2006.01) |
| H01F 10/32 | (2006.01) |
| H01L 27/22 | (2006.01) |
| G01R 33/12 | (2006.01) |
| G11B 5/37 | (2006.01) |
| G11B 5/39 | (2006.01) |
| G11C 11/16 | (2006.01) |

(52) U.S. Cl.
CPC .......... *G01R 33/1284* (2013.01); *G11B 5/012* (2013.01); *G11B 5/372* (2013.01); *G11B 5/3903* (2013.01); *H01F 10/329* (2013.01); *H01F 10/3286* (2013.01); *H01L 27/222* (2013.01); *H01L 43/04* (2013.01); *H01L 43/08* (2013.01); *H01L 43/10* (2013.01); *H01L 43/14* (2013.01); *G11C 11/161* (2013.01); *G11C 11/18* (2013.01)

(58) Field of Classification Search
CPC ....... G11B 5/012; G11C 11/161; G11C 11/18; H01F 10/3286; H01F 10/329
USPC ............................................ 257/421; 438/48
See application file for complete search history.

(56) References Cited

U.S. PATENT DOCUMENTS

| | | | |
|---|---|---|---|
| 9,230,627 | B2 | 1/2016 | Wu et al. |
| 9,293,160 | B1 | 3/2016 | Mihajlovic et al. |
| 9,343,658 | B2 | 5/2016 | Wang et al. |
| 9,401,163 | B2 | 7/2016 | McKinlay et al. |
| 9,406,872 | B1 | 8/2016 | Annunziata et al. |
| 2002/0135948 | A1* | 9/2002 | Funayama ............. B82Y 10/00 360/324.1 |
| 2009/0161265 | A1* | 6/2009 | Sugano ............... G01R 33/1284 360/324 |
| 2013/0027032 | A1* | 1/2013 | Gao .................... G01R 33/093 324/252 |
| 2014/0169088 | A1* | 6/2014 | Buhrman ................ G11C 11/18 365/158 |
| 2014/0226239 | A1* | 8/2014 | Mihajlovic ............. H01L 43/06 360/112 |
| 2015/0287426 | A1* | 10/2015 | Mihajlovic .......... G11B 5/3932 428/816 |
| 2016/0276006 | A1 | 9/2016 | Ralph et al. |
| 2017/0125078 | A1 | 5/2017 | Mihajlovic et al. |
| 2017/0141158 | A1 | 5/2017 | Daibou et al. |

OTHER PUBLICATIONS

International Search Report & Written Opinion for counterpart application No. PCT/US2018/020796 dated Jul. 6, 2018; 17 pages.
Fong Xuanyao et al: "Spin-Transfer Torque Devices for Logic and Memory: Prospects and Perspectives", IEEE Transactions on Computer Aided Design of Integrated Circuits and Systems, IEE Service Center, Piscataway, NJ, US, vol. 35, No. 1, Jan. 1, 2016, pp. 1-22.
Fong Xuanyao et al: "Spin-Transfer Torque Memories: Devices, Circuits, and Systems", Proceedings of the IEEE, IEEE, New York, US, vol. 104, No. 7, Jul. 1, 2016, pp. 1449-1488.
Erlingsson et al, "Determining the spin Hall conductance via charge transport"; arXiv:cond-mat/0503605v1 [cond-mat.mes-hall] Mar. 24, 2005; 5 pages; https://arxiv.org/pdf/cond-mat/0503605.pdf.
Espedal et al, "Spin Hall effect and spin swapping in diffusive superconductors"; Phys. Rev. B 95, 054509—Published Feb. 17, 2017; 3 pages; https://journals.aps.org/prb/abstract/10.1103/PhysRevB.95.054509.
Bromberg et al, "Experimental Demonstration of Four-Terminal Magnetic Logic Device with Separate Read- and Write-Paths", Electron Devices Meeting, 1988. IEDM '88. Technical Digest., International; Dec. 2014; DOI: 10.1109/IEDM.2014.7047159; 5 pages; https://www.researchgate.net/publication/269992707_Experimental_Demonstration_of_Four-Terminal_Magnetic_Logic_Device_with_Separate_Read-and_Write-Paths.
Rojas-Sanchez et al, "Spin pumping and inverse spin Hall effect in germanium", Phys. Rev. B 88, 064403—Published Aug. 5, 2013; 3 pages; https://journals.aps.org/prb/abstract/10.1103/PhysRevB.88.064403.
Angizi et al, "Energy Efficient In-Memory Computing Platform Based on 4-Terminal Spin Hall Effect-Driven Domain Wall Motion Devices"; GLSVLSI '17 Proceedings on the Great Lakes Sympsoium on VLSK 2017 pp. 77-82; May 2017; ISBN: 9781450349727; doi>10.1145/3060403.3060459; http://dl.acm.org/citation.cfm?id=3060403.3060459.

* cited by examiner

MAGNETIC SENSOR USING SPIN HALL EFFECT

CROSS-REFERENCE TO RELATED APPLICATION(S)

This application claims priority to and the benefit of U.S. patent application Ser. No. 62/518,540, filed on Jun. 12, 2017, and entitled, "MAGNETIC SENSOR USING SPIN HALL EFFECT", the entire content of which is incorporated herein by reference.

FIELD

The present invention relates to magnetic data recording and more particularly to a magnetic read sensor that utilizes spin Hall effect to detect the presence of a magnetic field.

INTRODUCTION

Computer systems commonly include an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the reading and writing functions.

The write head includes at least one coil, a write pole and one or more return poles. When current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic media, thereby recording a bit of data. The write field then travels through a magnetically soft under-layer of the magnetic medium to return to the return pole of the write head.

Magnetoresistive sensors such as a Giant Magnetoresistive (GMR) sensors, Tunnel Junction Magnetoresistive (TMR) sensors or a scissor type magnetoresistive sensors have been employed to read a magnetic signal from the magnetic media. Such a magnetoresistive sensor has an electrical resistance that changes in response to an external magnetic field. This change in electrical resistance can be detected by processing circuitry in order to read magnetic data from the magnetic media. The sensor is located between first and second magnetic shields and the spacing between the shields affects data density. A smaller spacing between the shields results in an increase in data density by increasing the number of bits that can be recorded and detected on a given length of data track. However, achieving the smaller spacing or reader gap can be challenging.

SUMMARY

In one aspect, the disclose relates to a magnetic sensor including a spin Hall layer including an electrically conductive, non-magnetic material, a magnetic free layer adjacent to the spin Hall layer, a pair of push terminals configured to enable an electrical current to pass through the magnetic free layer and the spin Hall layer in a direction that is perpendicular to a plane of the free and spin Hall layers, and a pair of sensing terminals configured to sense a voltage when the electrical current passes through the magnetic free layer and the spin Hall layer, where each of the push and sensing terminals is electrically isolated from the other terminals.

In another aspect, the disclosure relates to a method of fabricating a magnetic sensor, the method including providing a spin Hall layer including an electrically conductive, non-magnetic material, providing a magnetic free layer on the spin Hall layer, providing a pair of push terminals configured to enable an electrical current to pass through the magnetic free layer and the spin Hall layer in a direction that is perpendicular to a plane of the free and spin Hall layers, providing a pair of sensing terminals configured to sense a voltage when the electrical current passes through the magnetic free layer and the spin Hall layer, and electrically isolating each of the push and sensing terminals from the other terminals.

In another aspect, the disclosure relates to a magnetic sensor including a spin Hall layer including an electrically conductive, non-magnetic material, a magnetic free layer on the spin Hall layer, means for passing an electrical current through the magnetic free layer and the spin Hall layer in a direction that is perpendicular to a plane of the free and spin Hall layers, wherein the means for passing the electrical current includes a pair of push terminals, means for sensing a voltage when the electrical current passes through the magnetic free layer and the spin Hall layer, wherein the means for sensing the voltage includes a pair of sensing terminals; and means for electrically isolating each of the push and sensing terminals from the other terminals.

In another aspect, the disclosure relates to a magnetic sensor including a spin Hall layer including an electrically conductive, non-magnetic material, a magnetic free layer on the spin Hall layer, means for passing an electrical current through the magnetic free layer and the spin Hall layer in a direction that is perpendicular to a plane of the free and spin Hall layers, means for sensing a voltage when the electrical current passes through the magnetic free layer and the spin Hall layer, and means for electrically isolating the means for passing the electrical current from the means for sensing the voltage.

DETAILED DESCRIPTION

To address the problems described above, spin Hall effect (SHE) sensors are proposed with a narrower reader gap than conventional sensors. Referring now to the drawings, embodiments of sensors and fabrication methods for sensors having narrow reader gap are illustrated. In one aspect, these sensors feature a thin stack by having one free layer and one spin Hall layer. In one aspect, the thin stack, which corresponds with a narrow reader gap, may be achieved by electrically isolating terminals of the sensor. In one aspect, the sensors can include a pair of push terminals configured to enable an electrical current to pass through the magnetic free layer and the spin Hall layer in a direction that is perpendicular to a plane of the free and spin Hall layers, and a pair of sensing terminals configured to sense a voltage when the electrical current passes through the magnetic free layer and the spin Hall layer. In several aspects, these terminals can be isolated. In one aspect, a portion of one of the push terminals is disposed between the pair of sensing terminals, which can help to ensure the isolation of terminals. In one aspect, the SHE sensors disclosed herein can be four terminal devices with a single magnetic sensing free layer.

In contrast to this new design, conventional two terminal devices may have shared current injection and signal detection paths. As the result, such designs may include signal shunting and parasitic resistance, which can cause lower signal output.

Figure 1:
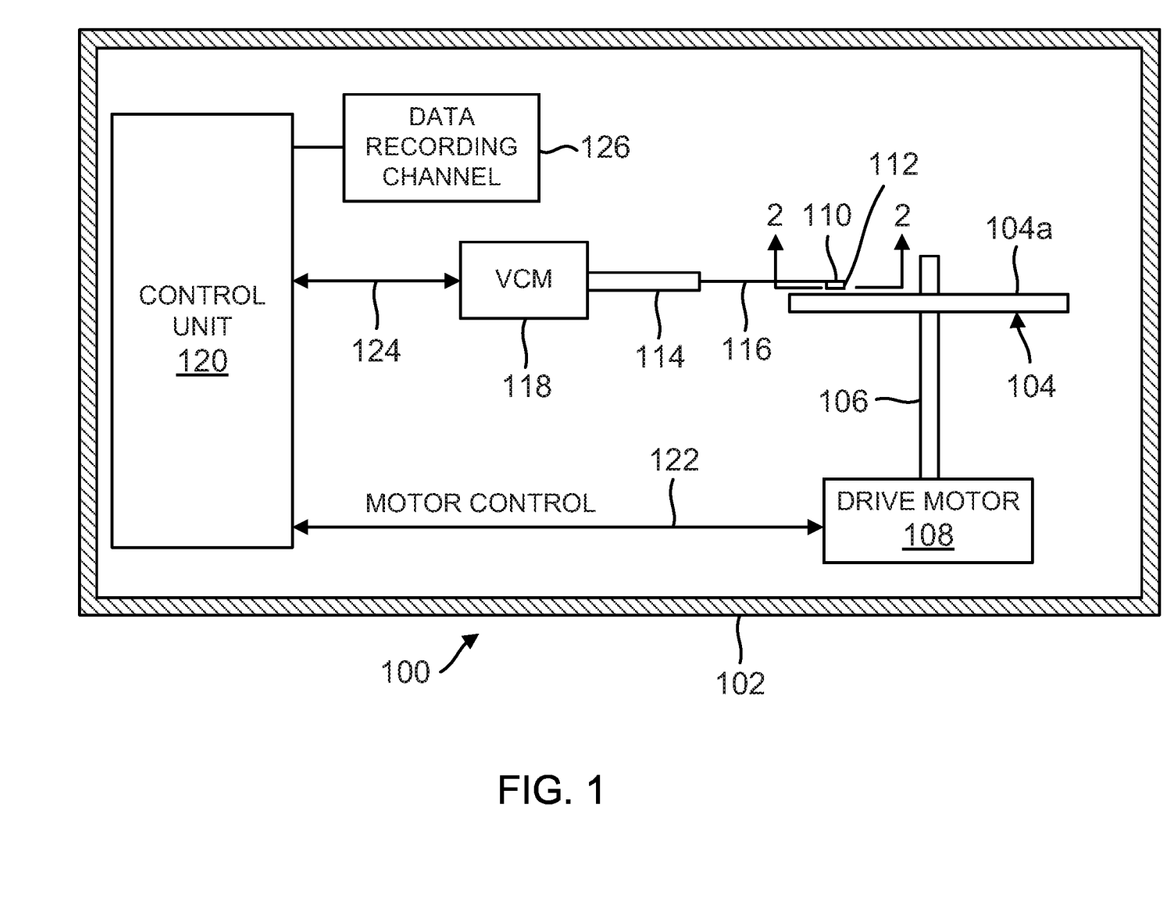
FIG. 1 is a schematic illustration of a disk drive system in accordance with one embodiment of the disclosure.

FIG. 1 is a schematic illustration of a disk drive system 100 in accordance with one embodiment of the disclosure. The disk drive system 100 includes a housing 102. At least one rotatable magnetic disk 104 is supported on a spindle 106 and rotated by a disk drive motor 108. The magnetic recording on each disk may be in the form of annular patterns of concentric data tracks (not shown) on the magnetic disk 104.

At least one slider 110 is positioned near the magnetic disk 104, each slider 110 supporting one or more magnetic head assemblies 112. As the magnetic disk rotates, slider 110 moves in and out over the disk surface 104a so that the magnetic head assembly 112 can access different tracks of the magnetic disk where desired data are written. Each slider 110 is attached to an actuator arm 114 by way of a suspension 116. The suspension 116 provides a slight spring force which biases the slider 110 against the disk surface 104a. Each actuator arm 114 is attached to an actuator means 118. The actuator means 118 as shown in FIG. 1 may be a voice coil motor (VCM). The VCM comprises a coil movable within a fixed magnetic field, the direction and speed of the coil movements being controlled by the motor current signals supplied by the control unit 120.

During operation of the disk storage system, the rotation of the magnetic disk 104 generates an air bearing between the slider 110 and the disk surface 104a, which exerts an upward force or lift on the slider. The air bearing thus counter-balances the slight spring force of the suspension 116 and supports the slider 110 off and slightly above the disk surface by a small, substantially constant spacing during normal operation.

The various components of the disk storage system are controlled in operation by control signals generated by control unit 120, such as access control signals and internal clock signals. Typically, the control unit 120 comprises logic control circuits, and a microprocessor. The control unit 120 generates control signals to control various system operations such as drive motor control signals on line 122 and head position and seek control signals on line 124. The control signals on line 124 provide the desired current profiles to optimally move and position the slider 110 to the desired data track on the media 104. Write and read signals are communicated to and from write and read heads 112 by way of recording channel 126. While the various sensor embodiments may be used in a reader (read head) of a disk drive as described in FIG. 1, the sensor embodiments may be generally applied to other types of data storage applications, such as in non-volatile memory (e.g., magneto-resistive random access memory (MRAM)).

Figure 2:
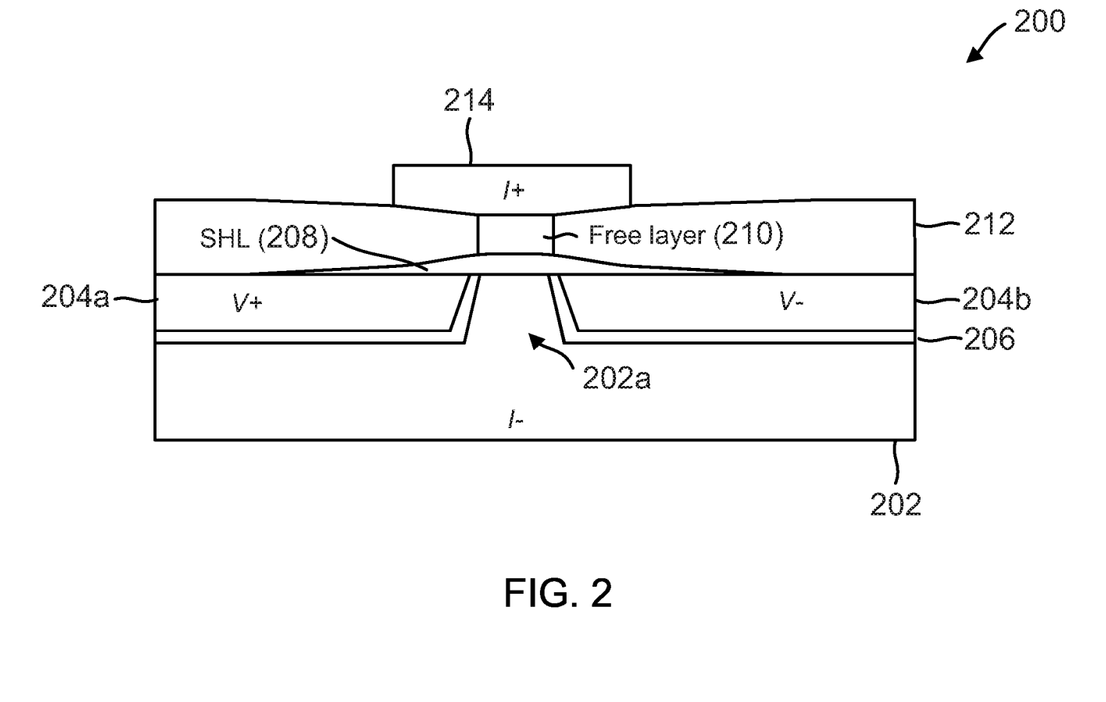
FIG. 2 is a side sectional view of a thin stack four terminal SHE reader with isolated terminals in accordance with one embodiment of the disclosure.

FIG. 2 is a side sectional view of a thin stack four terminal SHE reader 200 with isolated terminals in accordance with one embodiment of the disclosure. It is noted that the side sectional view is taken from a media facing surface (MFS) of the reader, or slider embodying the reader. The media facing surface (MFS) may also be referred to as an air bearing surface (ABS). The SHE reader 200 (e.g., reader stack) includes a bottom shield 202 at the bottom of the reader stack. The bottom shield 202 may also function as a lead/terminal for applying a current (e.g., push or charge current). The leads for applying the current may be referred to as push terminals. A portion (e.g., protrusion) 202a of the bottom push terminal 202 extends beyond upper surfaces of the bottom push terminal 202 in a central area of the reader. First and second voltage lead layers (204a, 204b) are positioned on the upper surfaces of the bottom push terminal 202. The voltage lead layers or leads (204a, 204b) can be referred to as sensor leads or sensing terminals. A first insulation layer 206 is positioned between the voltage sensing terminals (204a, 204b) and the bottom push terminal 202 such that the sensor terminals (204a, 204b) are electrically isolated from the bottom push terminal 202. The protrusion 202a of the bottom push terminal 202 is disposed between the sensor terminals (204a, 204b) such that they are isolated from one another.

A spin Hall layer (SHL) 208 is positioned on both the first and second voltage sensing terminals (204a, 204b) and the protrusion 202a of the bottom push terminal 202. A free layer (FL) 210 is positioned on a center portion of the SHL 208. A second insulation layer 212 is positioned along the sides of the free layer 210, on non-central areas (e.g., substantially flat areas) of the SHL 208, and on a portion of the sensor terminals (204a, 204b). In one aspect, the second insulation layer 212 is replaced by a combination of an insulation layer coating the aforementioned components and a side shield is positioned on the coating insulation layer such that it is disposed lateral to the free layer 210.

A top shield layer or top lead layer 214 is positioned on the free layer 210. This top layer/lead 214 can be used to apply the push or charge current and may be referred to as a push terminal. In one aspect, a capping layer may be formed between the top push terminal 214 and free layer 210. In one aspect, the top shield layer 214 may be a component of a top shield structure, such as when the SHE reader 200 is used within a hard disk drive.

The SHL 208 and free layer 210 can be located between the bottom push terminal 202 and top push terminal 214. In one aspect, the bottom and top push terminals (202, 214) are made of magnetic, non-magnetic, and/or conductive materials. Examples materials include NiFe, CoFe, Ru, Cr, Ir, Cu, alloys of these materials, and/or other suitable materials. In one aspect, the bottom and/or top push terminals (202, 214) may be made of non-magnetic materials (e.g., in applications that do not involve a hard disk drive). The distance between the top and bottom push terminals (e.g., shields) (202, 214) defines the gap spacing. In order to maximize data density, it is desirable to make the gap spacing as small as possible. This is because a smaller gap spacing allows the sensor to read a magnetic signal with small bit length along data tracks, thereby allowing the sensor to read more bits per inch of data track.

The magnetic free layer (FL) 210 may be made of a magnetic material such as one or more layers of Co—Fe, Co—Fe—B, NiFe or a Heusler alloy. The thickness of magnetic free layer 210 is preferably thicker than spin diffusion length of the free layer in order to fully polarize current and increase spin current injection into the spin Hall layer. The spin Hall layer (SHL) 208 can be made of a non-magnetic metal, which preferably has a large spin-orbital coupling. The SHL 208 is preferably constructed of a heavy metal such as Ta, W, Pt, Hf, Bi or alloys thereof. In another aspect, the SHL can be formed of any of the following materials (with all possible combinations contemplated):

(1) Fe—Co—M, where M is B, Si, P, Al, Hf, Zr, Nb, Ti, Ta, Mo, Mg, Y, Cu, Cr, and/or Ni;
(2) Fe—Co—M—MeOx granular films, where Me is Si, Al, Hf, Zr, Nb, Ti, Ta, Mg, Y, and/or Cr, and where M is B, Si, P, Al, Hf, Zr, Nb, Ti, Ta, Mo, Mg, Y, Cu, Cr, and/or Ni, and where x is a positive integer;
(3) (Fe—Co—M—MeOx)n multilayer films, where Me is Si, Al, Hf, Zr, Nb, Ti, Ta, Mg, Y, and/or Cr, and where M is B, Si, P, Al, Hf, Zr, Nb, Ti, Ta, Mo, Mg, Y, Cu, Cr, and/or Ni, and where n is a positive integer;
(4) Ni—Mn—Mg—Zn—FeOx-soft ferrites
(5) Fe—Co—M—(Ni—Mn—Ma—Zn—FeOx) granular films, where M is B, Si, P, Al, Hf, Zr, Nb, Ti, Ta, Mo, Mg, Y, Cu, Cr, and/or Ni, and where x is a positive integer; and
(6) Fe—Co—M—(Ni—Mn—Ma—Zn—FeOx)n multilayer films, where M is B, Si, P, Al, Hf, Zr, Nb, Ti, Ta, Mo, Mg, Y, Cu, Cr, and/or Ni, and where x and n are positive integers.

The capping layer, if included and not shown in FIG. 2, can be formed of a material such as Ta and or Ru or Rh.

The magnetic free layer 210 can have a magnetization that is generally oriented in a direction parallel with the media facing surface (MFS) and in a direction parallel to V+ to V−, but which is free to move its orientation in response to an external magnetic field. Biasing for the free layer 210 can be provided by the side shield layers (e.g., soft magnetic side shields) 212 which can be directly in contact with the top shield layer. Alternatively, biasing can be provided by permanent magnetic bias layers that can be located at either side of the magnetic free layer 210 and that can be electrically separated from top push terminal (e.g., top shield layer) 214. Each of the magnetic bias layers (side shields) can be separated from the magnetic free layer 210 and from the spin Hall layer by a non-magnetic, electrically insulating layer (see 312 in FIG. 3a). Other biasing mechanisms are also possible, such as back edge bias structures, in plane bias structures, etc.

Circuitry (not shown) can be provided to supply an electrical current i through the sensor that is oriented in a direction that is perpendicular to the planes of the top and bottom push terminals (e.g., top and bottom shield layers) (202, 214). In other words, the circuitry applies the current i in a direction that is generally parallel with the direction of a data track to be read by the sensor. The circuitry provides one example of a means for generating a voltage in the spin hall layer as a result of the spin Hall effect, as will be explained in greater detail herein below. In one aspect, the top and bottom push terminals (e.g., top and bottom shield layers) (202, 214) can be used as a means for passing an electrical current through the magnetic free layer and the spin Hall layer in a direction that is perpendicular to a plane of the free and spin Hall layers.

Because of the magnetization of the free layer (FL) 210, electrons traveling though the magnetic free layer 210 will become spin polarized. The orientation of spin polarization will be affected by the direction of the magnetization of the magnetic free layer 210. Therefore, as the magnetization of the magnetic free layer 210 changes in response to a magnetic field, the orientation of the spin polarization will change as well.

When these spin polarized electrons travel through the interface between the free-layer (FL) 210 and the spin Hall layer 208, due to spin accumulation at the interface, there will be a spin current induced and injected in to the spin Hall layer 208 as a result of spin accumulation at the interface between the free layer 210 and the spin Hall layer 208. Such a spin current can generate a voltage inside the spin Hall layer 208 as a result of the spin Hall effect. This voltage will be oriented parallel to the plane defined by the interface between the spin Hall layer 208 and the magnetic free layer 210 (e.g., horizontal plane in FIG. 2). This voltage can be oriented in a direction that is perpendicular to the direction of flow of the current i from top to the bottom or vice versa in FIG. 2, and also perpendicular to the spin polarization direction of magnetic free layer 210.

Circuitry (not shown) can be provided for measuring this voltage. The voltage generated by the Spin Hall Effect will change based on the relative orientation of the magnetization of the magnetic free layer 210 across the track width direction. By detecting a change in the voltage, the voltage measuring circuitry can, thereby, detect the presence of an external magnetic field such as from an adjacent magnetic media. The circuitry can be connected with sensing terminals/leads (204a/V+, 204b/V−) formed at either side of the spin Hall layer 208. The terminals/leads (204a/V+, 204b/V−), which will be discussed in greater detail below, can be integral with the spin Hall layer (being formed of the same material and even in the same patterning process) or can also be separate structures formed of an electrically conductive material that is different from the material of the spin Hall layer. In one aspect, terminals (204a/V+, 204b/V−) can be used as a means for sensing a voltage when the electrical current passes through the magnetic free layer and the spin Hall layer.

As shown in FIG. 2, the first insulation layer 206, an electrically insulating layer, can be provided between the voltage leads (V+, V−) and the adjacent bottom push terminal 202 (e.g., bottom shield), leaving the bottom push terminal 202 electrically connected with the spin Hall layer in the sensor area so as to prevent the current i from being shunted from the voltage leads to the bottom shield. This can be accomplished by forming an upwardly extending, electrically conductive portion (e.g., protrusion) 202a at the top of the bottom shield between the first insulation layer 206. This portion/protrusion 202a can be formed of the bottom push terminal material (e.g., bottom shield material), or can be a separately formed feature and can be self-aligned with the SHL in a common masking and ion milling process, as will be discussed in further detail below. The first insulation layer 206 and the second insulation layer 212 may be made of AlOx or another suitable insulating material. In one aspect, a width of the top surface of the protrusion 202a is made to be smaller than a width of the free layer 210. In such case, the area of the top surface of the protrusion 202a can be minimized to prevent shunting of SHE signal current to the voltage leads (V+, V−). In one aspect, the first insulation layer 206 and the second insulation layer 212, and possibly the width of the protrusion 202a made to be less than that of the free layer 210, may be used as a means for electrically isolating each of the push and sensing terminals from the other terminals, or more broadly as a means for electrically isolating the means for passing the electrical current from the means for sensing the voltage. As used herein, the term "isolation" may be defined as reducing or minimizing the signal shunting between terminals. In this respect, the free layer terminals (I+, I−) (e.g., push terminals) and SHL terminals (V+, V−) (e.g., voltage sensing terminals) may be said to be "isolated" or "electrically isolated". As can be seen in FIG. 2, the voltage sensing terminals (204a, 204b) are in electrical contact with the SHL 208 but electrically isolated from all other layers, and specifically from push terminals (214, 202).

In one aspect, the SHE sensors described herein may be referred to as anomalous SHE sensors or simply anomalous Hall effect sensors which involve the of the anomalous Hall effect. Aspects of anomalous SHE sensors/readers are described in U.S. Pat. No. 9,293,160, the entire content of which is incorporated by reference herein. In one aspect, the anomalous Hall effect basically utilizes the strong spin-orbital coupling within some magnetic free layer (e.g., free layer 210) itself. In such case, spin-orbital coupling can generate a hall voltage signal along the two outer surfaces perpendicular to ABS (e.g., left and right surfaces of the free layer 210). Thus, in one aspect, the SHE sensors used herein may be used in a configuration that effectively involves a combination of an inverse SHE sensor configuration and an anomalous sensor configuration. In one aspect, the SHE sensors used herein may be used in an inverse SHE sensor configuration rather than an anomalous sensor configuration.

Figure 3A:
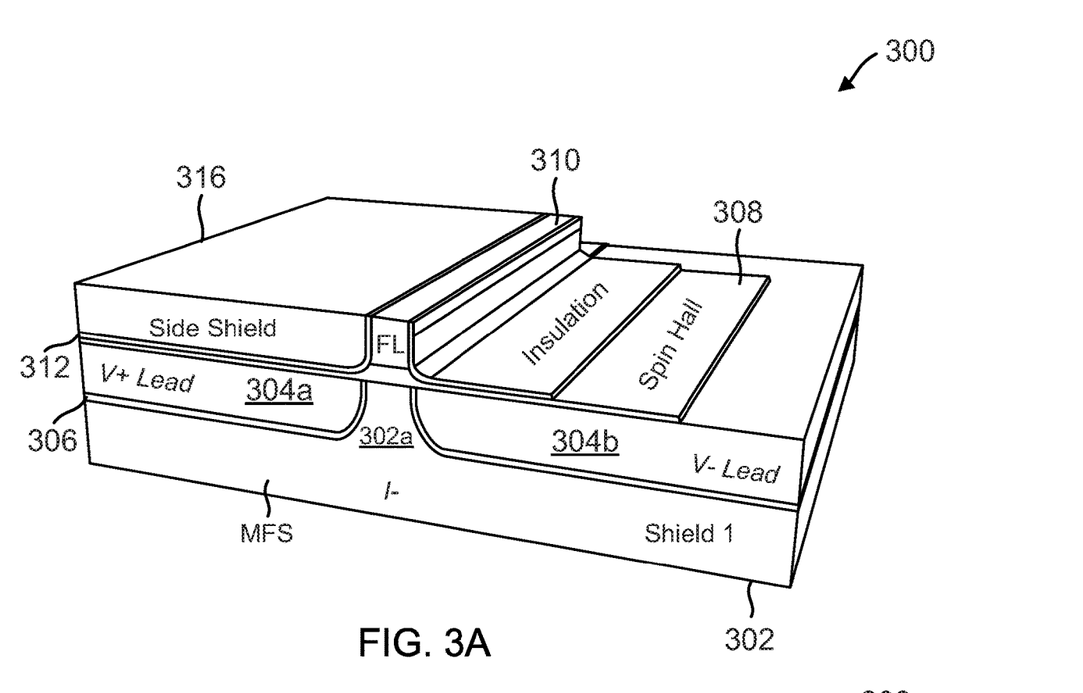
FIG. 3A is a perspective view of a thin stack four terminal spin Hall effect (SHE) reader with one side shield removed in accordance with one embodiment of the disclosure.

FIG. 3A is a perspective view of a thin stack four terminal spin Hall effect (SHE) reader 300 with one side shield removed in accordance with one embodiment of the disclosure. The SHE reader 300 (e.g., reader stack) includes a bottom push terminal 302 including a portion (e.g., protrusion) 302a, first and second voltage sensing layers (304a, 304b), a first insulation layer 306, a spin Hall layer (SHL) 308, a magnetic free layer 310, a second insulation layer 312, and a side shield layer 316. The other side shield layer (not shown in FIG. 3A but see FIG. 3D) and depicted side shield layer 316 are disposed directly lateral of the free layer 310. The second insulation layer 312 is disposed between the side shield layer 316 and the free layer 310. In one aspect, the use of side shield layers (e.g., 316) can stabilize the free layer (e.g., 310) in a magnetic reader sensor (e.g., hard disk drive application) in order to obtain a linear response of the voltage signal caused by an external field from the media.

While not shown in FIG. 3A (see 214 in FIG. 2), a top shield layer or top lead layer can be positioned on the free layer 310.

As compared to the SHE reader 200 of FIG. 2, the SHE reader 300 of FIG. 3 includes side shields 316 and a spin hall layer 308 that extends the full length of the first and second voltage sensing layers (304a, 304b). Besides these distinctions, the structure and function of the depicted layers is similar to or the same as is described for the SHE reader 200 of FIG. 2.

The media facing surface (MFS) is also shown in FIG. 3A.

Figure 3B:
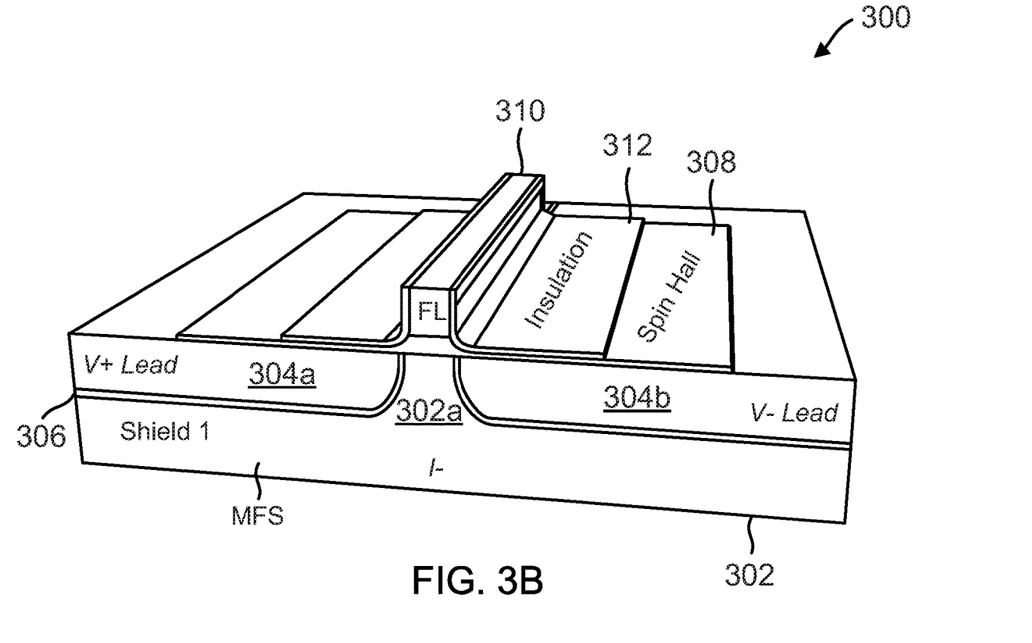
FIG. 3B is a front perspective view of the thin stack SHE reader of FIG. 2A with the side shields removed in accordance with one embodiment of the disclosure.

FIG. 3B is a front perspective view of the thin stack SHE reader 300 of FIG. 3A with the side shields removed in accordance with one embodiment of the disclosure.

Figure 3C:
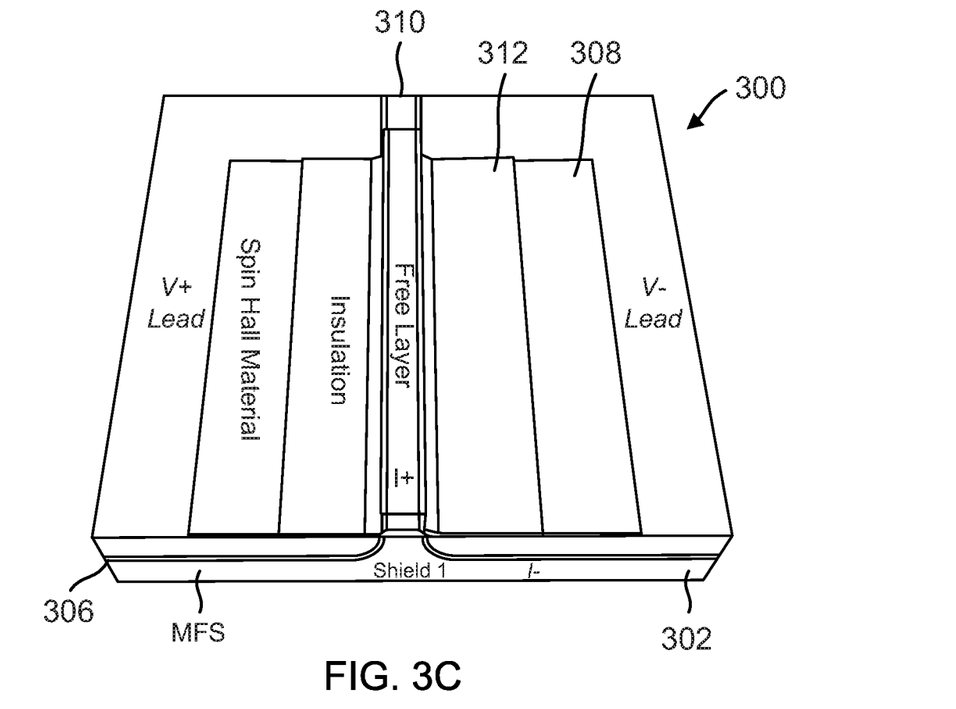
FIG. 3C is a top perspective view of the thin stack SHE reader of FIG. 2A with the side shields removed in accordance with one embodiment of the disclosure.

FIG. 3C is a top perspective view of the thin stack SHE reader 300 of FIG. 3A with the side shields removed in accordance with one embodiment of the disclosure.

Figure 3D:
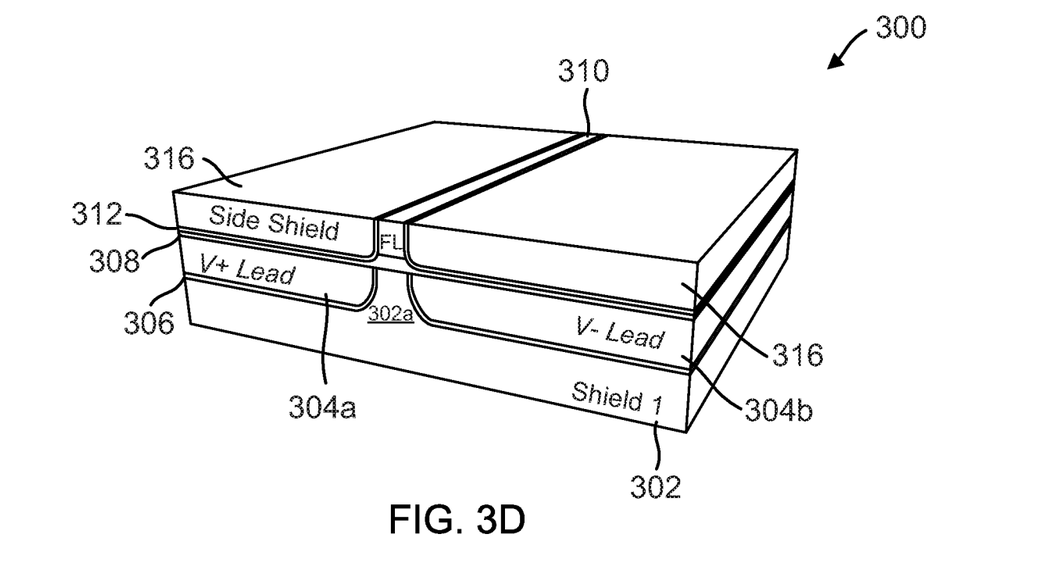
FIG. 3D is a perspective view of the thin stack SHE reader of FIG. 2A with both side shields illustrated in accordance with one embodiment of the disclosure.

FIG. 3D is a perspective view of the thin stack SHE reader 300 of FIG. 3A with both side shields 316 illustrated in accordance with one embodiment of the disclosure.

Figure 4:
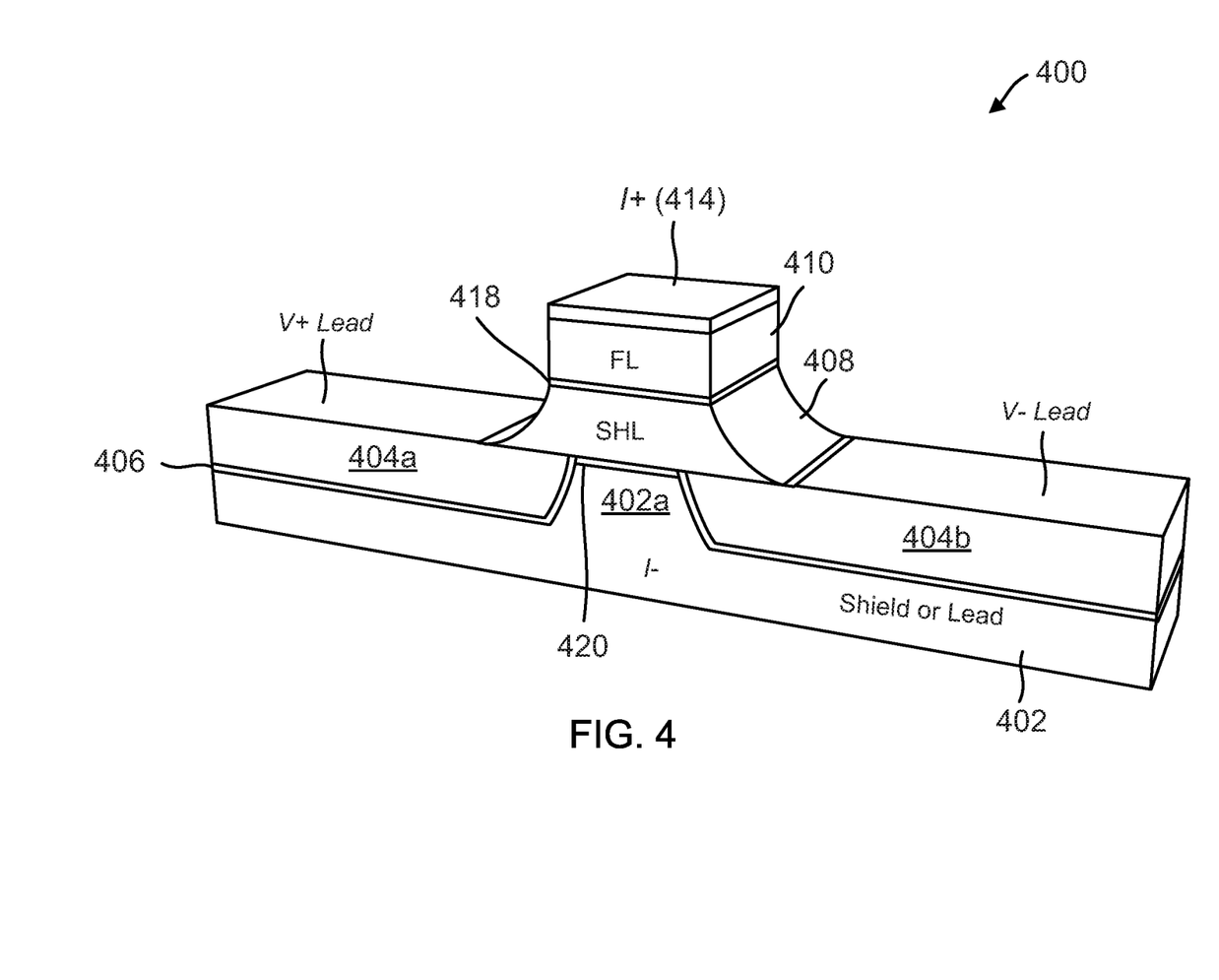
FIG. 4 is a perspective sectional view of a thin stack four terminal SHE reader in accordance with one embodiment of the disclosure.

FIG. 4 is a perspective sectional view of a thin stack four terminal SHE reader 400 in accordance with one embodiment of the disclosure. In one aspect, SHE reader 400 can represent a sectioned portion of reader 300 of FIGS. 3A to 3D. The reader 400 includes four terminals/leads including a V+ sensing terminal 404a, a V− sensing terminal 404b, a I− bottom push terminal 402, a I+ top push terminal 414, and an insulating layer 406 disposed between the bottom push terminal 402 and voltage sensing terminals (404a, 404b). As discussed above, a push or charge current can flow from the I− to I+ terminals (402,414), or vice versa, and through the free layer (FL) 410 and Spin Hall layer (SHL) 408. Effectively the direction of the current is perpendicular to the plane of the free layer (FL) 410 or shields, and thus the reader 400 may be referred to a current perpendicular to plane (CPP) type reader. When this current flows, a Spin Hall voltage develops in the plane at the SHL track edges, and is picked up by the V+ and V− voltage leads/terminals (404a, 404b). This Spin Hall voltage may be used by a read head as an output when a magnetic signal is input from an adjacent media, or it may be used in a test chip to study Spin Hall materials, free layer materials, high impedance materials, test-chip circuitry, or other parameters related to fabrication of the reader. In addition, the four terminal device test-chip can be realized to study SHE Spin Orbit Torque (SOT) and memory. In such case, the free layer FL may be replaced with a magnetic tunnel junction (MTJ), and in this configuration, current may flow through the SHL. Aspects of SHE based memory are described in U.S. Patent Publ. No. 2017/0125078, the entire content of which is incorporated by reference herein.

In one aspect, the reader 400 further includes a first high impedance layer 418 to reduce or minimize signal shunting between the free layer (FL) 410 and the SHL 408. As used herein, the term "isolation" may be defined as reducing or minimizing the signal shunting between terminals. In this respect, the free layer terminals (I+, I−) (e.g., push terminals) and SHL terminals (V+, V−) (e.g., voltage sensing terminals) may be said to be isolated. The first high impedance layer 418 can be made of CoFeB, Ru, CoFeHfO, and/or other suitable materials. In one aspect, the first high impedance layer 418 can have an impedance (e.g., sheet resistivity) of at least 120 ohms by centimeter or ohm-cm.

In one aspect, the reader 400 further includes a second high impedance layer 420 to reduce or minimize signal shunting between the SHL 408 and the bottom push terminal (I−) 402. The second high impedance layer 420 can be made of CoFeB and/or other suitable materials. In one aspect, the reader 400 further includes a breaking layer (not shown) made of Ru and positioned between the second high impedance layer 420 and the SHL 408 (e.g., on layer 420). The breaking layer (e.g., a non-magnetic conductive layer) can be used to break the interaction (e.g., magnetic interaction) between the SHL 408 and bottom push terminal (I−) 402. In one aspect, the second high impedance layer 420 can have an impedance (e.g., sheet resistivity) of at least 120 ohms by centimeter or ohm-cm. In one aspect, the impedance of layers 418 and 420 is specifically selected and/or designed first to ensure that SHE signal shunting is minimized, and second to allow push current to pass there-through, to thereby enable SHE. In one aspect, the first and second high impedance layers may also be referred to as encapsulation layers of the SHL 408.

With all of the various insulating layers and high impedance layers, each of the four terminals/leads of reader 400 can be isolated. With the isolated terminals/leads, the SHL 408 and FL 410 can be made very thin, thereby decreasing the reader gap. In one aspect, the free layer 410 can have a thickness of about 5 to 15 nanometers (nm). In one aspect, the SHL 408 can have a thickness of about 3 to 10 nanometers (nm).

In one aspect, the width of the protrusion 402a of the bottom push terminal 402 (e.g., width at location of layer 420) can be made to be smaller than the width of the FL 410 at the location of layer 418. This has the effect of minimizing the area of the top surface of 402a and thereby minimizing the area where potential shunting of the SHE signal might occur. In such case, shunting from the SHL 408 to the bottom push terminal (e.g., bottom shield/lead) 402 can be minimized. More specifically, use of the small protrusion width may avoid overlay between the voltage (V+, V−) and current (I−, I+) leads. If the overlay occurs, only some of the injected current will flow to the bottom push terminal/lead (e.g., some will flow into the signal sensing (V+ or V−) leads), thereby reducing the injected current. This may be referred to as input/current shunting. Thus, one reason for using the small protrusion width is that the technique then provides for a process friendly layer to layer overlay design. In one aspect, the first high impedance layer 418 and the second high impedance layer 420 may be used (collectively with other insulation layers such as 206 and 212 in FIG. 2 and a minimized area of the top surface of 402a or such that the width of 402a is less than that of free layer 410) as a means for electrically isolating each of the push and sensing terminals from the other terminals, or more broadly as a means for electrically isolating the means for passing the electrical current from the means for sensing the voltage.

In one aspect, the isolation of the voltage sensing and push terminals may be accomplished using two primary features. In such case, the first feature is the insulation layer 206 disposed between the sensing terminals (204a, 204b) and the push terminals (214, 202). The second feature is the width of the top surface of the protrusion 202a made to be less than that of the free layer 210. In one aspect, a third feature helps to accomplish the isolation of terminals. More specifically, the third feature is either or both of the first and second high impedance layers (418, 420).

Figure 5:
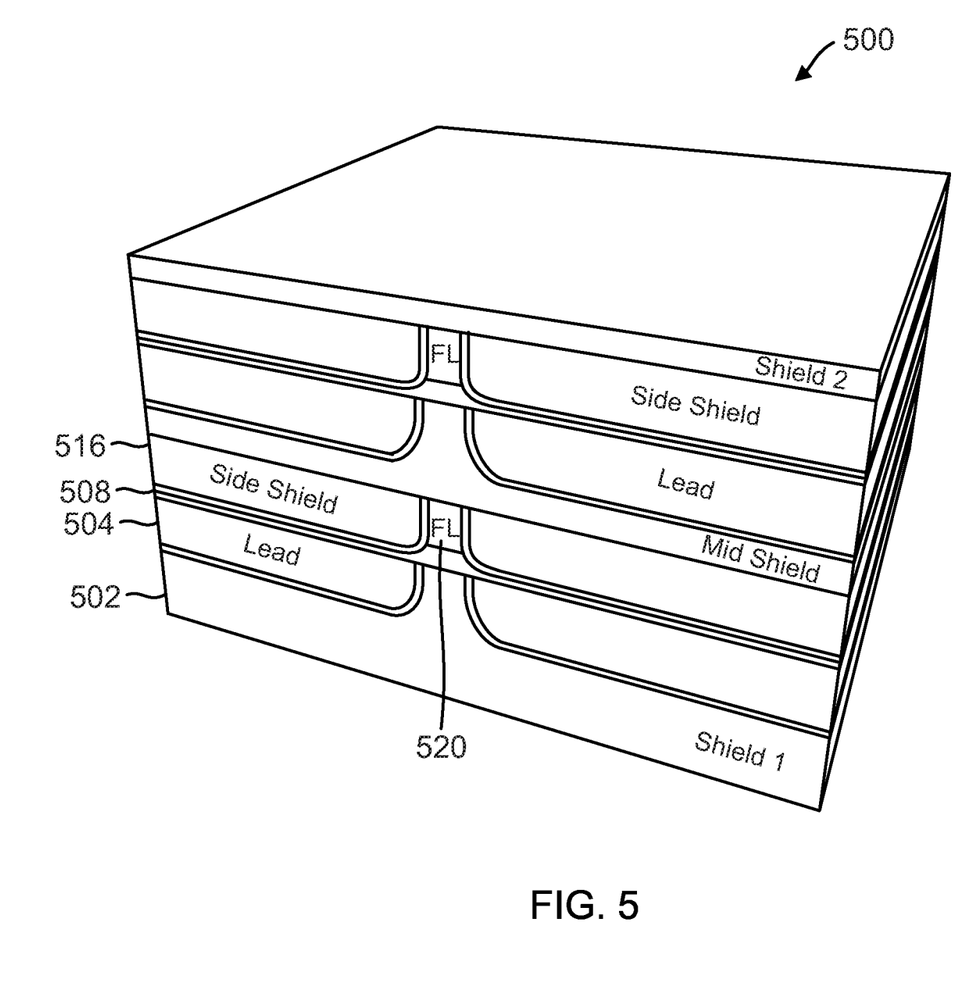
FIG. 5 is a perspective view of a four terminal two dimensional SHE reader with a thin stack in accordance with one embodiment of the disclosure.

FIG. 5 is a perspective view of a four terminal two dimensional SHE reader 500 with a thin stack in accordance with one embodiment of the disclosure. Reader 500 includes a first and second reader stacks, each including a bottom/mid shield 502, voltage sensing leads 504, an SHL 508, a free layer 510, and side shields 516. In one aspect, reader 500 can be used in a two dimensional magnetic recording (TDMR) type application. In one aspect, each of the reader stacks has a structure and function that similar to or the same as SHE readers 200, 300, or 400 described above.

FIGS. 6A to 6F illustrate a process for fabricating a four terminal SHE reader with a thin stack in accordance with one embodiment of the disclosure. In particular embodiments, the process may be used to fabricate any of the magnetic sensors (e.g., SHE readers) described herein. In stage 652, the process uses photolithography and chemical mechanical polishing (CMP) to form a bottom shield/lead (e.g., bottom push terminal) 602 in an insulator 601. The bottom lead 602 may be made of NiFe and/or other suitable materials. The insulator 601 may be made of AlOx and/or other suitable materials.

Figure 6A:
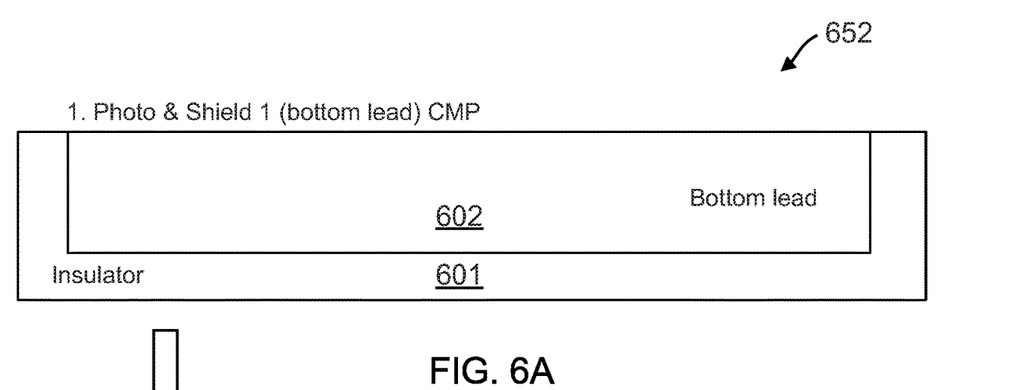
FIGS. 6A to 6F illustrate a process for fabricating a four terminal SHE reader with a thin stack in accordance with one embodiment of the disclosure.
Figure 6B:
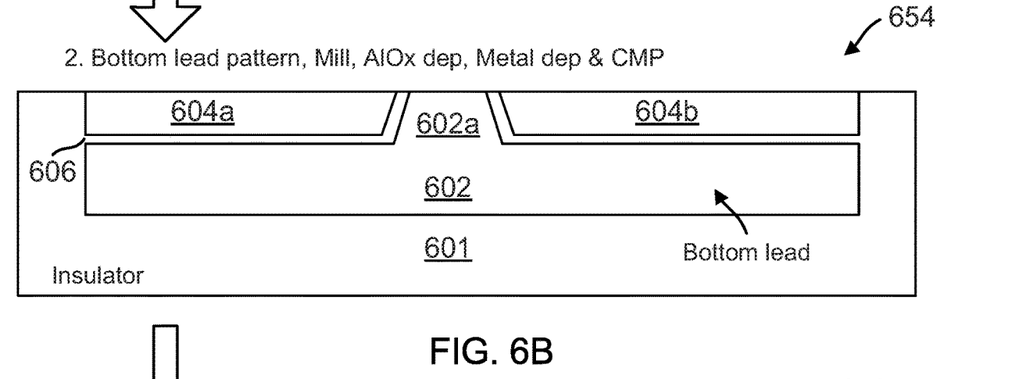

In stage 654, the process patterns the bottom lead 602 using milling (e.g., to form a protrusion), deposits an insulator 606, deposits metal for the voltage sensing leads (e.g., sensing terminals) (604a, 604b), and planarizes the top working surface using CMP. The insulator may be made of AlOx, SiN, TaOx, MgOx, another suitable material, and/or combinations of these materials. The voltage leads may be made of magnetic materials such as NiFe, non-magnetic materials such as Ru, Cr, NiCr, and/or combinations of these materials.

Figure 6C:
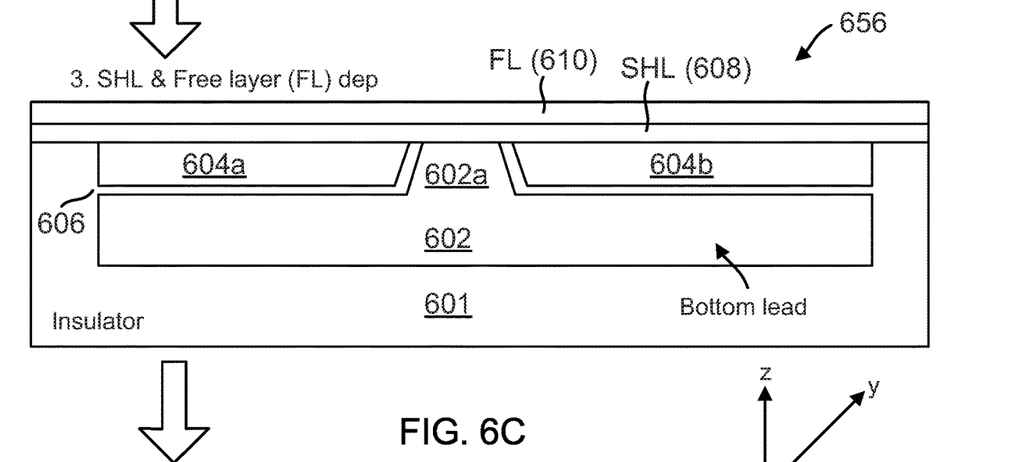

In stage 656, the process deposits the spin Hall layer (SHL) 608 and free layer 610. The SHL 608 may be made of a non-magnetic metal, which preferably has a large spin-orbital coupling. The SHL 608 is preferably constructed of a heavy metal such as Ta, W, Pt, Hf, Bi or alloys thereof. In one aspect, the SHL 608 may be encapsulated at the top (adjacent the free layer 610) and bottom (adjacent the shield/push terminal 602) with magnetically high impedance materials such as CoFeB, CoFeHfO or their alloys as described above. In such case, the bottom encapsulation layer 420 (e.g., CoFeB) can be formed after stage 652 such that it is deposited on and patterned with the bottom lead 602. In one aspect, a breaking layer made of Ru is deposited on patterned with bottom encapsulation layer 420. The top encapsulation layer 418 can be formed (e.g., deposited) just after the SHL 608 is deposited in stage 656. The free layer 610 may be made of a magnetic material such as one or more layers of Co—Fe, Co—Fe—B, NiFe or a Heusler alloy.

In stage 658, the process patterns the SHL 608 and free layer 610 using milling or other suitable patterning techniques. In stage 608, the process may pattern the SHL 608 and free layer 610 in a y direction, effectively into the page as depicted with the small Cartesian coordinate indicator.

Figure 6D:
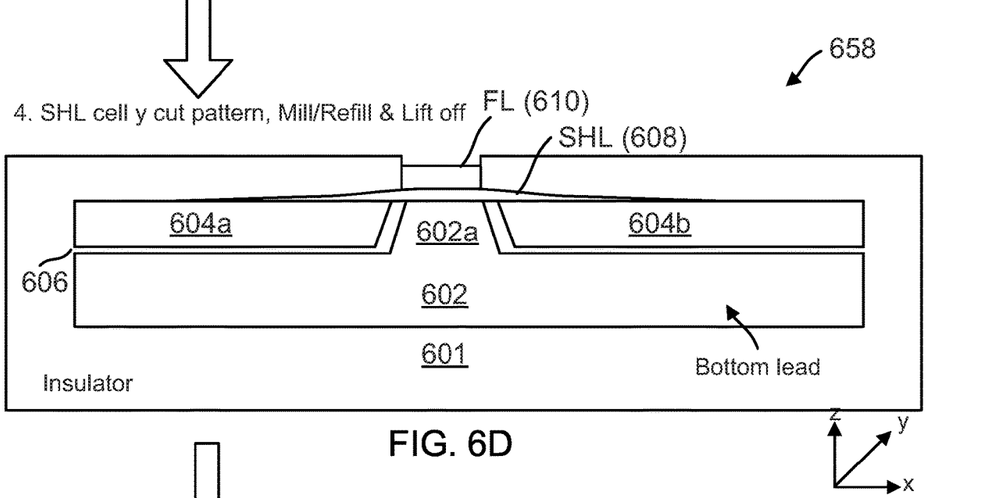
Figure 6E:
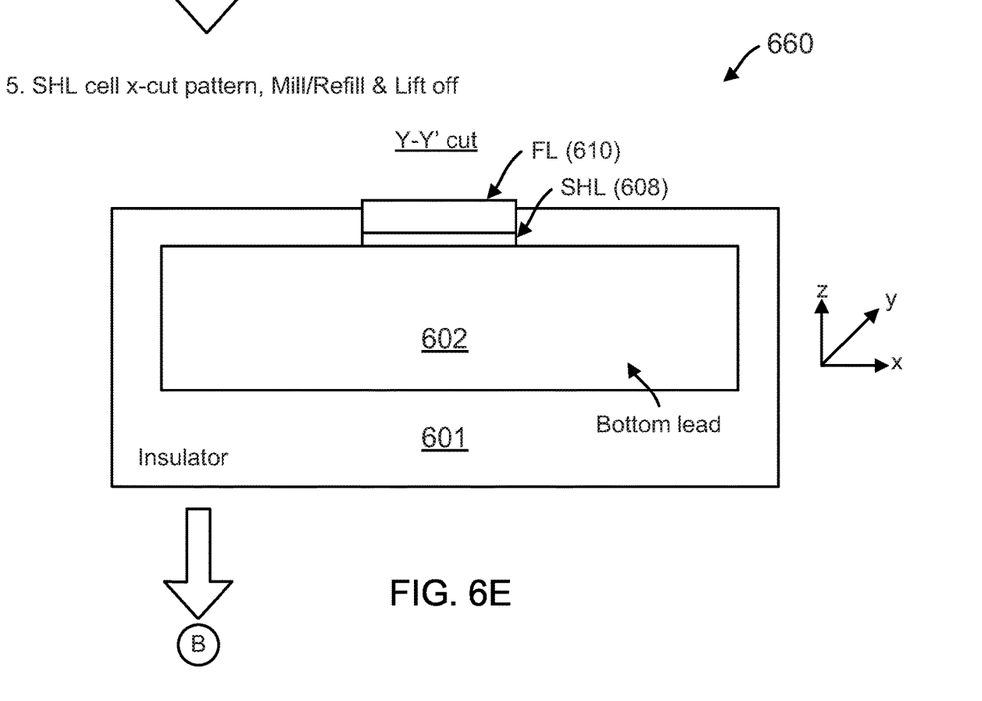

In stage 660, the process further patterns the SHL 608 using milling such that the free layer 610 and SHL 608 are patterned in the x direction, effectively across the page for FIG. 6D as depicted with the small Cartesian coordinate indicator. The resulting y-y' cut view is shown for stage 660 in FIG. 6E.

Figure 6F:
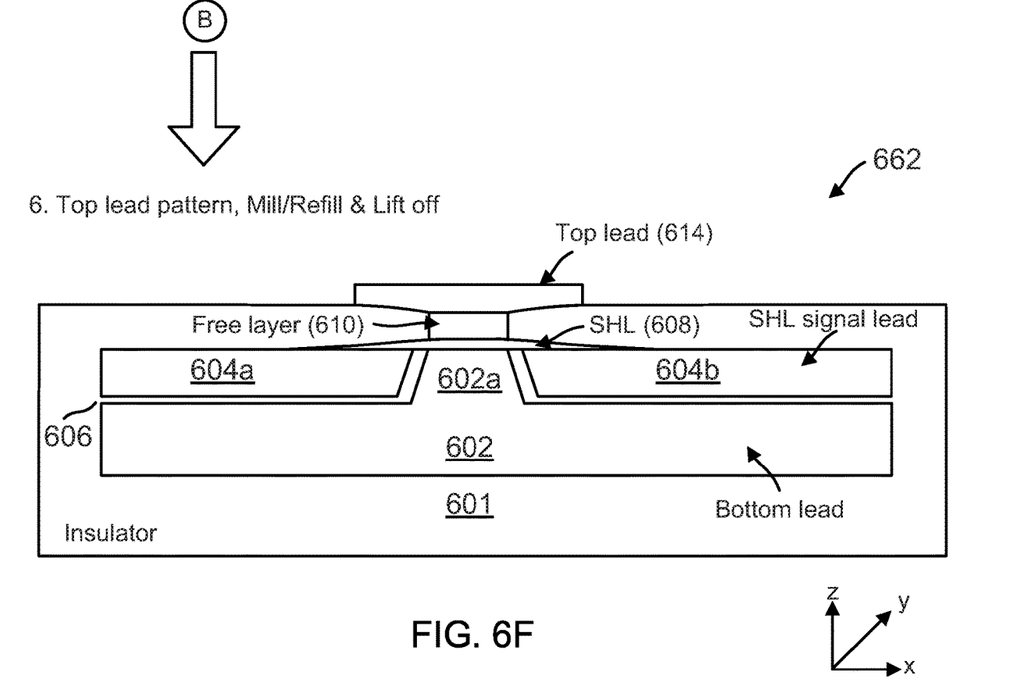

In stage 662, the process deposits and patterns the top lead layer (e.g., top push terminal) 614 using milling or other suitable patterning techniques.

In one aspect, the process may be self-aligning.

In one aspect, the process can be used to minimize the area of the bottom shield protrusion 602a, and preferably make the width of the bottom shield protrusion (e.g., bottom push terminal protrusion) 602a at the uppermost surface less than the width of the free layer 610. The benefits of this technique are described above.

In one embodiment, the process can perform the sequence of actions in a different order. In another embodiment, the process can skip one or more of the actions. In other embodiments, one or more of the actions are performed simultaneously. In some embodiments, additional actions can be performed.

In one aspect, the process forms a novel K5 like junction shape to form the bottom lead or shield which current flows to, down from the stack's top. The K5's "pocket" consists of voltage sensing leads in contact with SHL. Aspects of fabricating such K5 readers are described in U.S. Pat. No. 8,941,954, the entire content of which is incorporated by reference herein.

Figure 7:
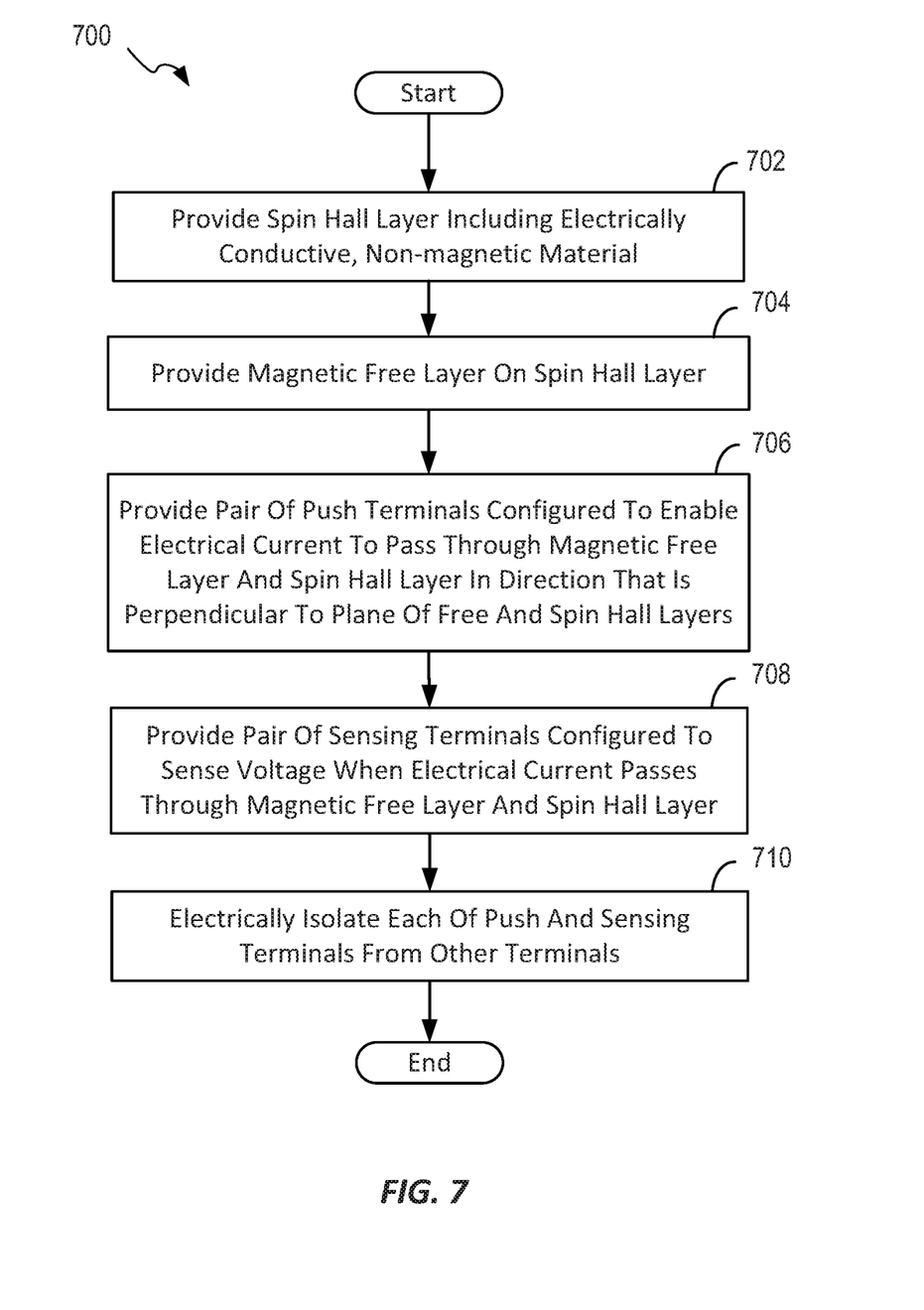
FIG. 7 illustrates another process for fabricating a four terminal SHE reader with a thin stack in accordance with one embodiment of the disclosure.

FIG. 7 illustrates another process 700 for fabricating a four terminal SHE reader with a thin stack in accordance with one embodiment of the disclosure. In particular embodiments, the process may be used to fabricate any of the magnetic sensors (e.g., SHE readers) described herein. At block 702, the process provides a spin Hall layer comprising an electrically conductive, non-magnetic material. At block 704, the process provides a magnetic free layer on the spin Hall layer. At block 706, the process provides a pair of push terminals configured to enable an electrical current to pass through the magnetic free layer and the spin Hall layer in a direction that is perpendicular to a plane of the free and spin Hall layers. At block 708, the process provides a pair of sensing terminals configured to sense a voltage when the electrical current passes through the magnetic free layer and the spin Hall layer. At block 710, the process electrically isolates each of the push and sensing terminals from the other terminals.

In one embodiment, the process can perform the sequence of actions in a different order. In another embodiment, the process can skip one or more of the actions. In other embodiments, one or more of the actions are performed simultaneously. In some embodiments, additional actions can be performed.

The terms "above," "below," and "between" as used herein refer to a relative position of one layer with respect to other layers. As such, one layer deposited or disposed above or below another layer may be directly in contact with the other layer or may have one or more intervening layers. Moreover, one layer deposited or disposed between layers may be directly in contact with the layers or may have one or more intervening layers.

It shall be appreciated by those skilled in the art in view of the present disclosure that although various exemplary fabrication methods are discussed herein with reference to magnetic readers, the methods, with or without some modifications, may be used for fabricating other types of SHE devices.

In several embodiments, the deposition of layers can be performed using a variety of deposition sub-processes, including, but not limited to physical vapor deposition (PVD), sputter deposition and ion beam deposition, and chemical vapor deposition (CVD) including plasma enhanced chemical vapor deposition (PECVD), low pressure chemical vapor deposition (LPCVD) and atomic layer chemical vapor deposition (ALCVD). In other embodiments, other suitable deposition techniques known in the art may also be used.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A magnetic sensor, comprising:
a spin Hall layer comprising an electrically conductive, non-magnetic material;
a magnetic free layer adjacent to the spin Hall layer;
a pair of push terminals configured to enable an electrical current to pass through the magnetic free layer and the spin Hall layer in a direction that is perpendicular to a plane of the magnetic free layer and the spin Hall layer; and
a pair of sensing terminals electrically and directly coupled with the spin Hall layer and configured to sense a voltage when the electrical current passes through the magnetic free layer and the spin Hall layer,
wherein each of the pair of push and sensing terminals is electrically isolated from the other terminals.

2. The magnetic sensor of claim 1, wherein a portion of one push terminal of the pair of push terminals is disposed between the pair of sensing terminals.

3. The magnetic sensor of claim 2, wherein a width of the portion is equal to or smaller than a width of the magnetic free layer, wherein the widths are measured at an air bearing surface of the magnetic sensor.

4. The magnetic sensor of claim 1:
wherein the spin Hall layer is encapsulated at a top surface, closest to the magnetic free layer, by a first layer comprising an alloy selected from the group consisting of CoFeB, CoFeHfO, and combinations thereof; and
wherein the spin Hall layer is encapsulated at a bottom surface, furthest from the magnetic free layer, by a bi-layer comprising Ru on CoFeB.

5. The magnetic sensor of claim 1:
wherein the pair of push terminals comprises a bottom push terminal and a top push terminal;
wherein the pair of sensing terminals are on the bottom push terminal;
wherein the spin Hall layer is on the pair of sensing terminals;
wherein the magnetic free layer is on the spin Hall layer; and
wherein the top push terminal is on the magnetic free layer.

6. The magnetic sensor of claim 5, further comprising:
a first insulation layer between the bottom push terminal and the pair of sensing terminals; and
a second insulation layer between the top push terminal and the pair of sensing terminals.

7. The magnetic sensor of claim 5:
wherein the bottom push terminal comprises a protrusion disposed between the pair of sensing terminals; and
wherein the spin Hall layer is on the protrusion.

8. The magnetic sensor of claim 7, wherein a width of the protrusion is equal to or smaller than a width of the magnetic free layer, wherein the widths are measured at an air bearing surface of the magnetic sensor.

9. The magnetic sensor of claim 7, further comprising:
a top encapsulation layer disposed between the spin Hall layer and the magnetic free layer, the top encapsulation layer comprising an alloy selected from the group consisting of CoFeB, CoFeHfO, and combinations thereof;
a bottom encapsulation layer disposed between the spin Hall layer and the protrusion, the bottom encapsulation layer comprising CoFeB; and
a breaking layer disposed between the bottom encapsulation layer and the spin Hall layer, the breaking layer comprising Ru.

10. The magnetic sensor of claim 1:
wherein the spin Hall layer comprises a material selected from the group consisting of Ta, W, Pt, Hf, Bi, Fe—Co—M, Fe—Co—M—MeOx, and combinations thereof;
wherein M is B, Si, P, Al, Hf, Zr, Nb, Ti, Ta, Mo, Mg, Y, Cu, Cr, and/ or Ni;
wherein Me is Si, Al, Hf, Zr, Nb, Ti, Ta, Mg, Y, and/or Cr;
wherein x is a positive integer; and
wherein the magnetic free layer comprises a material selected from the group consisting of Co—Fe, Co—Fe—B, NiFe, a Heusler alloy, and combinations thereof.

11. A magnetic random access memory (MRAM) cell comprising the magnetic sensor of claim 1.

12. The magnetic sensor of claim 1, wherein the pair of sensing terminals are coupled to a same surface of the spin Hall layer.

13. A method of fabricating a magnetic sensor, comprising:
providing a spin Hall layer comprising an electrically conductive, non-magnetic material;
providing a magnetic free layer on the spin Hall layer;
providing a pair of push terminals configured to enable an electrical current to pass through the magnetic free layer and the spin Hall layer in a direction that is perpendicular to a plane of the magnetic free layer and the spin Hall layer;
providing a pair of sensing terminals in direct contact with the spin Hall layer and configured to sense a voltage when the electrical current passes through the magnetic free layer and the spin Hall layer; and
electrically isolating each push and sensing terminal of the pair of push and sensing terminals from the other terminals.

14. The method of claim 13, wherein providing the pair of push terminals comprises providing the pair of push terminals such that a portion of one push terminal of the pair of push terminals is disposed between the pair of sensing terminals.

15. The method of claim 14, wherein a width of the portion is equal to or smaller than a width of the magnetic free layer, wherein the widths are measured at an air bearing surface of the magnetic sensor.

16. The method of claim 13, further comprising:
providing a top encapsulation layer disposed between the spin Hall layer and the magnetic free layer, the top encapsulation layer comprising an alloy selected from the group consisting of CoFeB, CoFeHfO, and combinations thereof;
providing a bottom encapsulation layer disposed between the spin Hall layer and one of the push terminals, the bottom encapsulation layer comprising CoFeB; and
providing a breaking layer disposed between the bottom encapsulation layer and the spin Hall layer, the breaking layer comprising Ru.

17. The method of claim 13:
wherein providing the pair of push terminals comprises providing a bottom push terminal and a top push terminal;
wherein providing the pair of sensing terminals comprises providing the pair of sensing terminals on the bottom push terminal;
wherein providing the spin Hall layer comprises providing the spin Hall layer on the pair of sensing terminals; and
wherein providing the pair of push terminals comprises providing the top push terminal on the magnetic free layer.

18. The method of claim 17, further comprising:
providing a first insulation layer between the bottom push terminal and the pair of sensing terminals; and
providing a second insulation layer between the top push terminal and the pair of sensing terminals.

19. The method of claim 17:
wherein providing the bottom push terminal comprises providing a protrusion disposed between the pair of sensing terminals; and
wherein providing the spin Hall layer comprises providing the spin Hall layer on the protrusion.

20. The method of claim 19, wherein a width of the protrusion is equal to or smaller than a width of the magnetic free layer, wherein the widths are measured at an air bearing surface of the magnetic sensor.

21. The method of claim 19, further comprising:
providing a top encapsulation layer disposed between the spin Hall layer and the magnetic free layer, the top encapsulation layer comprising an alloy selected from the group consisting of CoFeB, CoFeHfO, and combinations thereof;
providing a bottom encapsulation layer disposed between the spin Hall layer and the protrusion, the bottom encapsulation layer comprising CoFeB; and
providing a breaking layer disposed between the bottom encapsulation layer and the spin Hall layer, the breaking layer comprising Ru.

22. The method of claim 13:
wherein the spin Hall layer comprises a material selected from the group consisting of Ta, W, Pt, Hf, Bi, Fe—Co—M, Fe—Co—M—MeOx, and combinations thereof;
wherein M is B, Si, P, Al, Hf, Zr, Nb, Ti, Ta, Mo, Mg, Y, Cu, Cr, and/ or Ni;
wherein Me is Si, Al, Hf, Zr, Nb, Ti, Ta, Mg, Y, and/or Cr;
wherein x is a positive integer; and
wherein the magnetic free layer comprises a material selected from the group consisting of Co—Fe, Co—Fe—B, NiFe, a Heusler alloy, and combinations thereof.

23. The method of claim 13, wherein providing the pair of sensing terminals comprises providing the pair of sensing terminals such that the pair of sensing terminals are coupled to a same surface of the spin Hall layer.

24. A magnetic sensor, comprising:
a spin Hall layer comprising an electrically conductive, non-magnetic material;
a magnetic free layer on the spin Hall layer;
means for passing an electrical current through the magnetic free layer and the spin Hall layer in a direction that is perpendicular to a plane of the magnetic free layer and the spin Hall layer, wherein the means for passing the electrical current comprises a pair of push terminals;
means for sensing a voltage when the electrical current passes through the magnetic free layer and the spin Hall layer, wherein the means for sensing the voltage comprises a pair of sensing terminals directly coupled with the spin Hall layer; and
means for electrically isolating each of the push and sensing terminals from the other terminals, wherein the means for electrically isolating each of the push and sensing terminals comprises at least one insulation layer.

25. A magnetic sensor, comprising:
a spin Hall layer comprising an electrically conductive, non-magnetic material;
a magnetic free layer on the spin Hall layer;
means for passing an electrical current from a first push terminal to a second push terminal through the magnetic free layer and the spin Hall layer in a direction that is perpendicular to a plane of the magnetic free layer and the spin Hall layer;
means for sensing a voltage in a pair of sensing terminals directly coupled with the spin Hall layer when the electrical current passes through the magnetic free layer and the spin Hall layer; and
means for electrically isolating the means for passing the electrical current from the means for sensing the voltage with at least one insulation layer.

* * * * *